United States Patent
Park et al.

(10) Patent No.: US 11,221,131 B2
(45) Date of Patent: Jan. 11, 2022

(54) FLEXIBLE LIGHTING APPARATUS AND METHOD OF MANUFACTURING THE SAME

(71) Applicant: JILLITE CORP., Incheon (KR)

(72) Inventors: Hunsu Park, Gimpo-si (KR); Jun Lim, Paju-si (KR); Jin Sung Kim, Bucheon-si (KR)

(73) Assignee: JILLITE CORP., Incheon (KR)

( * ) Notice: Subject to any disclaimer, the term of this patent is extended or adjusted under 35 U.S.C. 154(b) by 0 days.

(21) Appl. No.: 16/962,364

(22) PCT Filed: Dec. 4, 2018

(86) PCT No.: PCT/KR2018/015240
§ 371 (c)(1),
(2) Date: Jul. 15, 2020

(87) PCT Pub. No.: WO2019/139256
PCT Pub. Date: Jul. 18, 2019

(65) Prior Publication Data
US 2020/0348012 A1    Nov. 5, 2020

(30) Foreign Application Priority Data

Jan. 15, 2018    (KR) .................... 10-2018-0005126

(51) Int. Cl.
*F21V 23/00*    (2015.01)
*H05K 1/18*    (2006.01)
(Continued)

(52) U.S. Cl.
CPC ............ *F21V 23/005* (2013.01); *F21V 29/83* (2015.01); *H05K 1/0287* (2013.01); *H05K 1/181* (2013.01);
(Continued)

(58) Field of Classification Search
CPC . F21S 4/22; H05K 1/181; H05K 2201/10106; H05K 2201/10113
See application file for complete search history.

(56) References Cited

U.S. PATENT DOCUMENTS

| 10,553,540 B2* | 2/2020 | Sunshine ............ H01L 23/3121 |
| 2003/0072153 A1* | 4/2003 | Matsui ................. H05K 1/0281 362/231 |

(Continued)

FOREIGN PATENT DOCUMENTS

| KR | 1020090033592 | 4/2009 |
| KR | 1020130026852 | 3/2013 |

(Continued)

OTHER PUBLICATIONS

English translation of International Search Report from corresponding PCT Appln No. PCT/KR2018/015240, dated Mar. 11, 2019.
(Continued)

*Primary Examiner* — Alan B Cariaso
(74) *Attorney, Agent, or Firm* — Kevin J. Carroll; Grossman, Tucker, Perreault & Pfleger PLLC

(57) ABSTRACT

Flexible lighting apparatus and method of manufacturing the same disclosed. The flexible light apparatus includes a net-structured flexible printed circuit board (FPCB), being manufactured in shape of net structure in which a plurality of through-holes are formed separately from each other in a body of the net-structured FPCB, and having predetermined circuit patterns formed thereon, a plurality of light sources, being mounted on at least one of predetermined mounting location among intersection and branch of the net-structured FPCB, and a supporting layer, having apertures formed thereon and being fixed to support the net-structured FPCB at bottom surface.

5 Claims, 5 Drawing Sheets

(51) Int. Cl.
*H05K 1/02* (2006.01)
*F21V 29/83* (2015.01)
*F21Y 115/10* (2016.01)
*F21Y 107/70* (2016.01)

(52) U.S. Cl.
CPC .......... *H05K 1/189* (2013.01); *F21Y 2107/70* (2016.08); *F21Y 2115/10* (2016.08); *H05K 2201/10106* (2013.01)

(56) References Cited

U.S. PATENT DOCUMENTS

| | | | |
|---|---|---|---|
| 2006/0007059 A1* | 1/2006 | Bell | G06F 1/163 345/55 |
| 2008/0218369 A1* | 9/2008 | Krans | H01L 51/0097 340/691.1 |
| 2010/0277666 A1* | 11/2010 | Bertram | F21S 4/22 349/61 |
| 2011/0090671 A1* | 4/2011 | Bertram | F21V 9/30 362/84 |
| 2013/0027963 A1* | 1/2013 | Van Herpen et al. | H05K 1/189 362/551 |
| 2015/0109765 A1* | 4/2015 | Sepkhanov | F21V 29/83 362/147 |
| 2015/0330610 A1* | 11/2015 | Song | F21V 19/0035 362/6 |
| 2016/0227618 A1* | 8/2016 | Meerbeek | H05B 45/24 |
| 2017/0005077 A1* | 1/2017 | Kim | G02B 6/0068 |
| 2017/0067621 A1* | 3/2017 | Anselm | F21S 8/026 |
| 2017/0254518 A1* | 9/2017 | Vasylyev | F21V 9/08 |
| 2018/0135840 A1* | 5/2018 | Golle | F21V 33/006 |
| 2018/0149349 A1* | 5/2018 | Shum | F21V 29/773 |
| 2019/0027534 A1* | 1/2019 | Rotzoll | H01L 25/0753 |
| 2020/0124267 A1* | 4/2020 | Shin | F21K 9/20 |

FOREIGN PATENT DOCUMENTS

| | | |
|---|---|---|
| KR | 10101708550 | 2/2017 |
| KR | 1020170121348 | 11/2017 |
| KR | 101797279 | 12/2017 |

OTHER PUBLICATIONS

English translation of the Written Opinion from corresponding PCT Appln. No. PCT/KR2018/015240, dated Mar. 11, 2019.

* cited by examiner

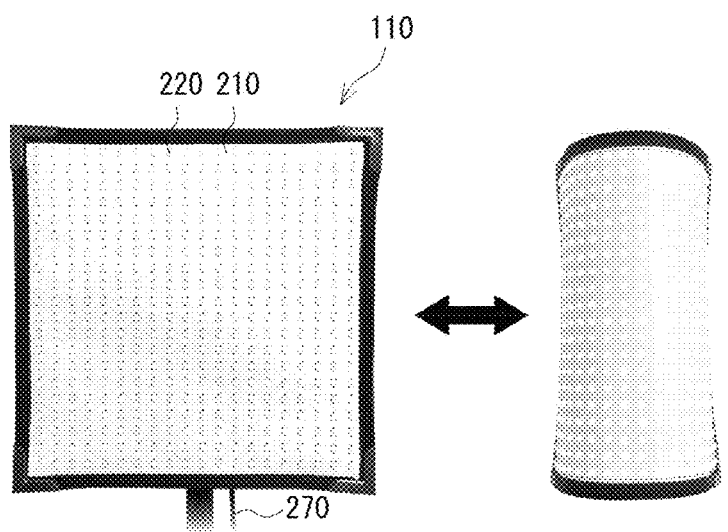
FIG. 2B
(PRIOR ART)
FIG. 2A
(PRIOR ART)
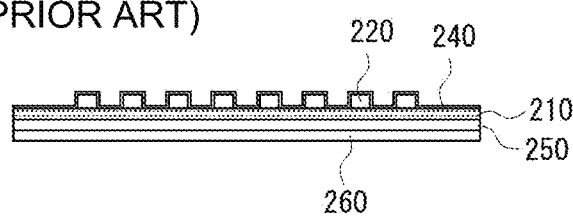
FIG. 2C
(PRIOR ART)

FLEXIBLE LIGHTING APPARATUS AND METHOD OF MANUFACTURING THE SAME

FIELD OF INVENTION

The present invention relates to a flexible lighting apparatus and a method of manufacturing the same.

BACKGROUND

Lighting apparatus having a plurality of light source such as LED is widely used for various purposes such as stage/broadcast lighting, photography. LED operates by drive current, and has a high lamp efficiency with a low amount of energy.

This lighting apparatus is connected electrically to a dimmer to control color temperature and brightness according to purpose of lighting effects.

Generally, since lighting apparatus should be installed at a place where lighting is required, a transportability to that place is required.

Previously, rigid plate-type lighting apparatus was generally used, but recently, flexible light apparatus that can be foldable or rollable by using flexible printed circuit board on which circuit patterns for providing each LED are formed are being developed.

However, the conventional flexible lighting apparatus has shortcomings that heat generated in operation cannot dissipate effectively due to FPCB of which body area is totally closed.

In order to solve this problem and protect lighting apparatus, a thin heat sinking plate was arranged on a bottom surface of FPCB, but a transformability of flexible lighting apparatus is weakened due to the presence of the heat sinking plate.

Aforementioned background is technical information acquired by the inventor for conceiving the present invention or acquired in course of implementing the present invention, and should not be regarded as being well known to the public prior to the filing of the present invention.

OBJECTIVES OF THE INVENTION

The present invention is intended to provide a lighting apparatus that can effectively dissipate heat generated in operation, maintain unconstrained transformability, and lower manufacturing cost by using a net-structured FPCB and a supporting layer having apertures that is made of fabric and by omitting a heat sinking plate.

Other objectives and advantages will be easily understood from the following description.

SUMMARY OF INVENTION

According to one aspect of the present invention, a flexible lighting apparatus is provided. The flexible light apparatus includes a net-structured flexible printed circuit board (FPCB), being manufactured in shape of net structure in which a plurality of through-holes are formed separately from each other in a body of the net-structured FPCB, and having predetermined circuit patterns formed thereon, a plurality of light sources, being mounted on at least one of predetermined mounting location among intersection and branch of the net-structured FPCB, and a supporting layer, having apertures formed thereon and being fixed to support the net-structured FPCB at bottom surface.

The flexible lighting apparatus may further include a plurality of guards that are fixed to the predetermined mounting locations and accommodate the light source in an interior space.

The plurality of through-holes having a predetermined width may be formed on each of an edge area and a portion of area on which the circuit patterns are not formed.

The first type of light sources and the second type of light sources may be mounted on each of the predetermined mounting locations.

Other aspects, features, and advantages will be more apparent from accompanying drawings, claims and detailed description.

Effects of the Invention

According to the present invention, it is advantageous that heat generated in operation can effectively dissipate, unconstrained transformability can be maintained, and manufacturing cost can be lowered by using a net-structured FPCB and a supporting layer having apertures that is made of fabric and by omitting a heat sinking plate.

BRIEF DESCRIPTION OF ACCOMPANYING DRAWINGS

FIGS. 2A-2C illustrate shape and structure of conventional flexible lighting apparatus;

DETAILED DESCRIPTION

Figure 1:
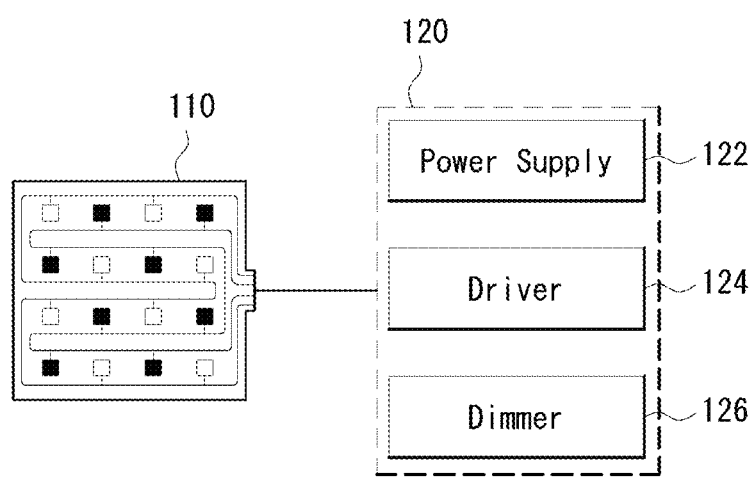
FIG. 1 illustrates a schematic of a lighting system having a conventional lighting apparatus.

The invention can be modified in various forms and specific embodiments will be described and shown below. However, the embodiments are not intended to limit the invention, but it should be understood that the invention includes all the modifications, equivalents, and replacements belonging to the concept and the technical scope of the invention.

The terms used in the following description are intended to merely describe specific embodiments, but not intended to limit the invention. An expression of the singular number includes an expression of the plural number, so long as it is clearly read differently. The terms such as "include" and "have" are intended to indicate that features, numbers, steps, operations, elements, components, or combinations thereof used in the following description exist and it should thus be understood that the possibility of existence or addition of one or more other different features, numbers, steps, operations, elements, components, or combinations thereof is not excluded.

Terms such as ~part, ~unit, ~module mean an element configured for performing a function or an operation. This can be implemented in hardware, software or combination thereof.

In describing the invention with reference to the accompanying drawings, like elements are referenced by like reference numerals or signs regardless of the drawing numbers and description thereof is not repeated. But, the accompanying drawings may be exaggerated to effectively describe embodiments of the present invention so the present invention will not be limited to a lighting apparatus manufactured by dimensions shown on the accompanying drawings. If it is determined that detailed description of known techniques involved in the invention makes the gist of the invention obscure, the detailed description thereof will not be made.

FIG. 1 illustrates a schematic of a lighting system having a conventional lighting apparatus.

Referring to FIG. 1, the lighting system may include a lighting apparatus 110 and a dimming unit 120.

The lighting apparatus 110 includes a plurality of light sources. The plurality of light sources can be divided into the first type light source 210 and the second type light source 220 that have different color temperatures and are arranged alternately.

For example, each of the first type light source and the second type light source may be a warm color light source or cold color light source, and each light sources may be LED. The warm color light source may emit, for example, tungsten color light, and the cold color light source may emit, for example, daylight color light(sunlight).

The plurality of light sources are driven by drive currents that are provided through conducting paths that are separately formed for each type of light sources. The conducting paths can be formed as conducting patterns on PCB on which the plurality of light sources are mounted, and each of conducting paths are electrically connected to corresponding wires in a cable that connects the dimming unit 120 and the lighting apparatus 110.

The dimming unit 120 may include a power supply 122, a driver 124, and a dimmer 126.

The power supply 122 provides power for turning on each of light sources in the lighting apparatus 110.

The driver 124 controls drive current level for turning on each of light sources and/or at least one of the first and the second type light sources in the lighting apparatus 110 in response to a dimming control signal provided from the dimmer 126.

The dimmer 126 generates the dimming control signal for controlling brightness and color temperature of the lighting apparatus 110 in response to user's control.

When user manipulates the dimmer 126 or operating means on a console (not shown) connected to the dimmer 126 for a lighting effect, the dimmer 126 generates the dimming control signal, and drive currents having level corresponding to the dimming control signal are provided to each of lighting sources in the lighting apparatus 110 to control an amount of light and the color temperature. Schemes of controlling brightness and color temperature of lighting apparatus 110 by use of the dimmer 126 are well-known in the relevant field of art so detailed description will be omitted.

FIG. 2 illustrates shape and structure of conventional flexible lighting apparatus.

Previously, a lighting apparatus with light sources that are turn on in response to the dimming control signal is manufactured to be in shape of a rigid plate, but recently, for the convenience of transport, a flexible lighting apparatus with unconstrained transformability such as being foldable or rollable is developed.

As shown in FIG. 2(c), a flexible lighting apparatus 110 is manufactured by fixing light sources 220 on predetermined locations on a flexible printed circuit board (FPCB) 210 on which circuit patterns are formed. In order to provide drive currents to each of light sources 220, the circuit patterns are electrically connected to wires in a cable 270 that connects the lighting apparatus 110 and the dimming unit 120.

Top surface of FPCB 210 with light sources 220 is coated, for example, by a laminate film 240, a heat sinking plate 250 that is made of, for example, aluminum and has a predetermined thickness is arranged on a bottom surface of FPCB 210, and a support layer such as a woven fabric having apertures is arranged on a bottom surface of the heat sinking plate 250. As shown in FIG. 2, edge area of FPCB 210 are sealed with, for example, fabric or tape.

The lighting apparatus 110 that is manufactured in above-described method can be unrolled for use as shown in FIG. 2(a), and can be rolled or folded for transport as shown in FIG. 2(b).

But, since the conventional flexible lighting apparatus has FPCB 210 of which whole body area is totally closed, heat that the lighting apparatus 110 generates in operation cannot dissipate effectively to the outside.

In order to solve this problem and protect the lighting apparatus 110, a thin heat sinking plate 250 is arranged on the bottom surface of FPCB, but the transformability of the lighting apparatus 110 is degraded due to the presence of the heat sinking plate 250 and closed FPCB 210.

Figure 3:
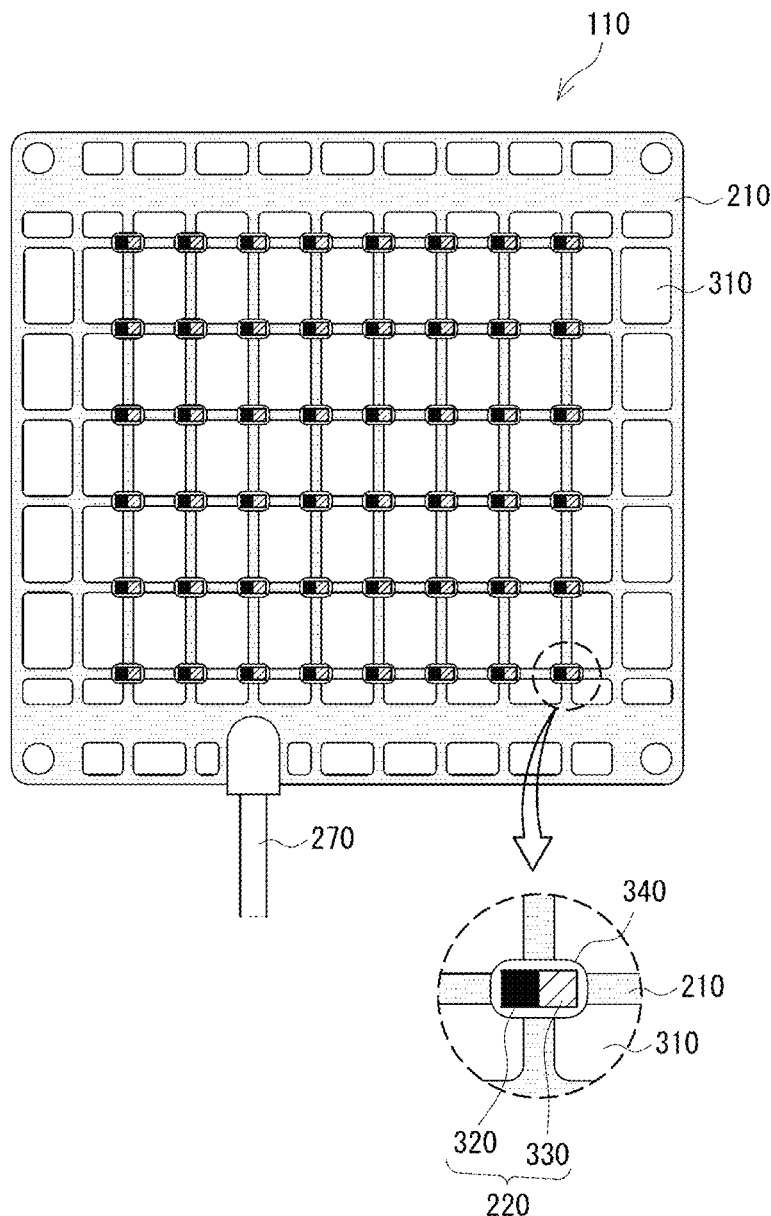
FIGS. 3 and 4A-4D illustrate shape and structure of flexible lighting apparatus according to one embodiment of the present invention.

FIGS. 3 and 4 illustrate shape and structure of flexible lighting apparatus according to one embodiment of the present invention.

Figure 4A:
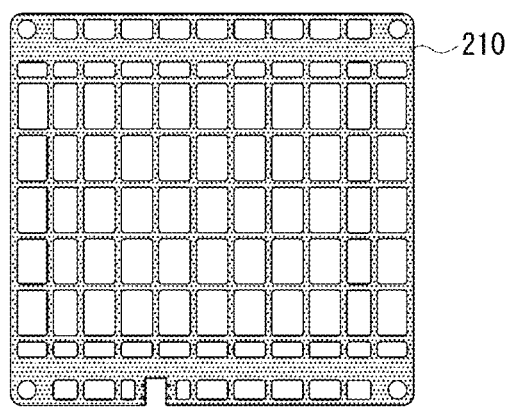

Referring FIGS. 3 and 4, the flexible lighting apparatus 110 includes a net-structured FPCB 210 of which body has a plurality of through-holes 310 that are formed to be separated from each other as shown in FIG. 4(a), and circuit patterns for providing drive currents to each of the plurality of light sources are formed on the net-structured FPCB 210. For example, an edge area and a portion of area on which the circuit patterns are not formed can be removed to form the through-holes 310.

Each light source 220 is mounted on predetermined mounting location of intersection or branch (namely, a portion of FPCB connecting two intersections) of the net-structure of FPCB 210. In this description, it is assumed that the intersection is selected as the mounting location.

Even though the first type light source 320 (for example, any one of cold color light source and warm color light source) and the second type light source 330 (for example, remaining one of cold color light source and warm color light source) can be mounted alternately on the mounting locations, it is also possible to mount a plurality of different types of light sources on one mounting location as shown in FIG. 3.

Compared to the conventional lighting apparatus 110 using FPCB 210 of which whole body area is totally closed, since the lighting apparatus 110 according to the present embodiment uses the net-structured FPCB 210 and light sources are mounted on a relatively small space, a fixability of light source 220 may be relatively weak.

Accordingly, in order to maintain the light source 220 to be fixed stably, a guard 340 that is formed of PVC material and has an interior space for accommodating the light source 220 can be used, and a bottom surface of the guard 340 can be fixed to the top surface of the net-structured FPCB 210 by use of adhesive.

A support layer 260 such as a woven fabric having apertures is arranged on a bottom surface of the net-structured FPCB 210.

Since FPCB 210 is formed to be the net structure having the plurality of through-holes 310 and the supporting layer 260 having apertures is arranged directly below the through-holes 310, it is advantageous that heat generated by the light sources 220 arranged on each of mounting locations in operation can dissipate directly through the supporting layer 260. The net-structured FPCB 210 and the supporting layer 260 can be fixed to each other by adhesive.

Since the lighting apparatus 110 according to the present embodiment has a superior heat dissipation feature, it is advantageous that the heat sinking plate 250 of the conventional lighting apparatus 110 can be omitted.

The top surface of the net-structured FPCB on which light sources 220 are mounted can be coated with, for example, a laminate film 240, and the edge area of the net-structured FPCB 210 can be sealed with fabric or tape.

It is also possible to cover the top surface of the net-structured FPCB 210 with a transparent fabric, or to coat with a transparent material such as urethane, silicon.

Figure 4B:
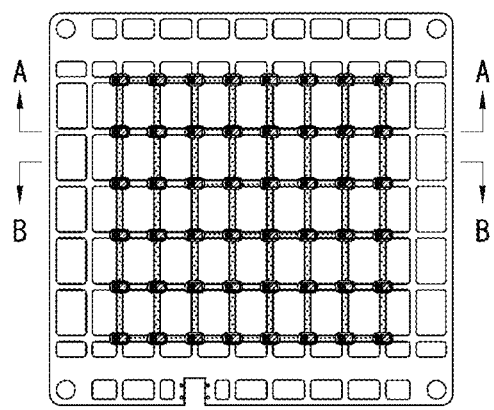
Figure 4C:
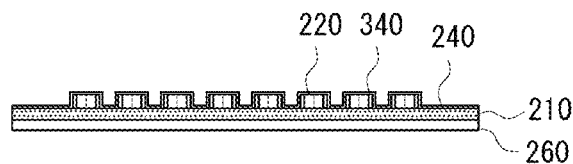

As shown in FIGS. 4(c) and (d), since light sources 220 are mounted on the net-structure FPCB 210 by use of guards 340, cross-sectional shapes at each location of the lighting apparatus 110 can be different from each other.

Referring to FIG. 4(c) illustrating a cross-section of A-A area on which light sources 220 are mounted in FIG. 4(b), light sources 220 are mounted on predetermined mounting locations, the laminate film 240 for coating is arranged on the top surface of the net-structured FPCB 210 with light sources mounted thereon, and the supporting layer 260 is arranged on the bottom surface of the net-structured FPCB 210.

Figure 4D:
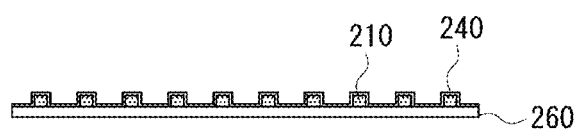

On the contrary, referring to FIG. 4(d) illustrating a cross-section of B-B area on which no light sources 220 are mounted in FIG. 4(b), branches having a predetermined width are arranged separately, the laminate film 240 for coating is arranged on the branches, and the supporting layer 260 is arranged below the branches.

As described above, since branches with the predetermined width are arranged at each side of through-hole 310 besides intersections, it is advantageous that heat generated by the lighting apparatus 110 in operation can dissipate effectively.

Aforementioned lighting apparatus 110 having the net-structured FPCB 210 without the heat sinking plate has a relatively improved transformability compared to the conventional lighting apparatus 110 using FPCB 210 of which whole body area is totally closed.

In addition, since relatively small area of FPCB 210 is used, it is advantageous that the lighting apparatus 110 can be manufactured at relatively low cost.

Figure 5:
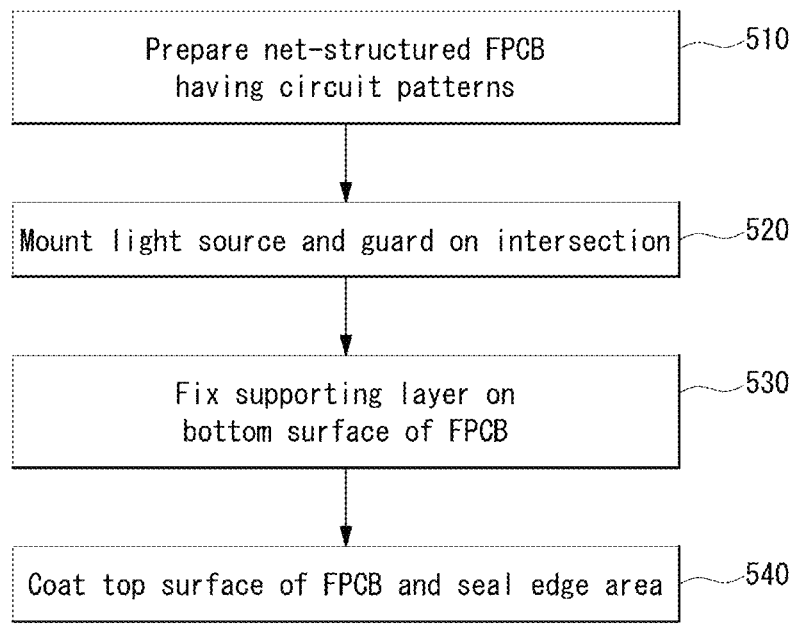
FIG. 5 is a flowchart illustrating method of manufacturing flexible lighting apparatus according to one embodiment of the present invention.

FIG. 5 is a flowchart illustrating method of manufacturing flexible lighting apparatus according to one embodiment of the present invention.

Referring to FIG. 5, at step 510, the net-structured FPCB 210 of which body area has a plurality of through-holes 310 that are separated from each other and on which the predetermined circuit patterns are formed is prepared.

At step 520, light sources 220 are mounted on each of predetermined mounting locations (for example, intersections and/or branches) on the net-structured FPCB 210. The first type light source 320 and the second type light source 330 can be mounted alternately on the mounting locations, and as shown in FIG. 3, a plurality of different types of light sources can be mounted on one mounting location.

In order to improve the fixability of light source 220 to be mounted on the relatively small space, the guard 340 having an interior space for accommodating the light source 220 can be used, and the guard 340 can be fixed on the top surface of net-structured FPCB 210 by adhesive. A resister can be further mounted, if needed.

At step 530, the supporting layer 260 having apertures is arranged on the bottom surface of net-structured FPCB 210 having light sources mounted thereon, and the net-structured FPCB 210 and the supporting layer 260 can be fixed to each other by adhesive. An exterior surface of the supporting layer 260 can be water-proof coated.

At step 540, the net-structured FPCB in which light sources 220 are mounted on the mounting locations of the top surface and the supporting layer 260 is arranged on bottom surface can be coated with, for example, a laminate film 240, and the edge area of the net-structured FPCB 210 can be sealed with fabric or tape. In order to provide drive currents to each of light sources 220, an additional step of electrically connecting the circuit patterns to wires in a cable 270 that connects the lighting apparatus 110 and the dimming unit 120 can be further performed.

As described with reference to accompanying drawings, the lighting apparatus according to the present embodiment can effectively dissipate heat generated in operation, maintain unconstrained transformability, and lower manufacturing cost by using the net-structured FPCB and the supporting layer having apertures that is made of fabric and by omitting the heat sinking plate.

While the invention has been described above with reference to exemplary embodiments, it will be understood by those skilled in the art that the invention can be modified and changed in various forms without departing from the concept and scope of the invention described in the appended claims.

What is claimed is:

1. A flexible lighting apparatus, comprising:
   a net-structured flexible printed circuit board (FPCB), the net-structured FPCB having a net structure in which a plurality of through-holes are formed separately from each other in a body of the net-structured FPCB, and having predetermined circuit patterns formed thereon;
   a plurality of light sources, each light source of the plurality of light sources being mounted at a predetermined mounting location on a top surface of the net-structured FPCB; and
   a supporting layer, the supporting layer having apertures formed thereon and being fixed on a bottom surface of the net-structured FPCB to support the net-structured FPCB; and
   a plurality of guards for mounting the plurality of light sources to the net-structured FPCB, each guard of the plurality of guards being fixed to the predetermined mounting location of a corresponding light source of the plurality of light sources and accommodating the corresponding light source in an interior space;
   wherein the predetermined mounting location for each light source of the plurality of light sources is a branch provided by the top surface of the net-structured FPCB, and wherein the branch has a predetermined width that is less than a width of each light source of the plurality of light sources and/or a width of each guard of the plurality of guards.

2. The flexible lighting apparatus of claim 1, wherein the supporting layer is fabric.

3. The flexible lighting apparatus of claim 1, wherein the supporting layer is woven fabric.

4. The flexible lighting apparatus of claim 1, wherein the plurality of guards are formed from polyvinyl chloride (PVC).

5. The flexible lighting apparatus of claim 4, wherein the plurality of guards are fixed to the top surface of the net-structured FPCB via adhesive.

\* \* \* \* \*